United States Patent
Lim

[19]

[11] Patent Number: 6,020,768
[45] Date of Patent: Feb. 1, 2000

[54] CMOS LOW-VOLTAGE COMPARATOR

[75] Inventor: Peter J. Lim, Sunnyvale, Calif.

[73] Assignee: Oak Technology, Inc., Sunnyvale, Calif.

[21] Appl. No.: 09/078,404

[22] Filed: May 13, 1998

[51] Int. Cl.[7] .................................................. H03K 5/153
[52] U.S. Cl. .................................. 327/77; 327/88; 327/89
[58] Field of Search ................................ 327/77, 88, 89, 327/65, 66; 330/257; 323/315, 316

[56] References Cited

U.S. PATENT DOCUMENTS

| | | | |
|---|---|---|---|
| 4,047,059 | 9/1977 | Rosenthal | 327/66 |
| 4,333,058 | 6/1982 | Hoover | 330/257 |
| 4,410,813 | 10/1983 | Barker et al. | 307/362 |
| 4,607,232 | 8/1986 | Gill, Jr. | 330/257 |
| 4,710,724 | 12/1987 | Connell et al. | 330/9 |
| 4,874,969 | 10/1989 | Meadows | 307/355 |
| 4,965,468 | 10/1990 | Nicollini et al. | 307/362 |
| 5,043,599 | 8/1991 | Zitta | 307/355 |
| 5,175,533 | 12/1992 | Krenik | 340/701 |
| 5,245,223 | 9/1993 | Lim et al. | 307/362 |
| 5,272,395 | 12/1993 | Vincelette | 307/355 |
| 5,291,149 | 3/1994 | Nunoshima | 330/257 |
| 5,412,309 | 5/1995 | Ueunten | 330/257 |
| 5,446,412 | 8/1995 | Kimyacioglu et al. | 330/285 |
| 5,491,455 | 2/1996 | Kuo | 330/253 |
| 5,589,785 | 12/1996 | Garavan | 327/63 |
| 5,598,094 | 1/1997 | Kiehl et al. | 323/315 |
| 5,600,275 | 2/1997 | Garavan | 327/307 |
| 5,672,993 | 9/1997 | Runaldue | 327/404 |

FOREIGN PATENT DOCUMENTS 0 523 380 A2   1/1993   European Pat. Off. .

*Primary Examiner*—Toan Tran
*Attorney, Agent, or Firm*—Townsend and Townsend and Crew LLP

[57] ABSTRACT

A comparator circuit providing for improved symmetry of operation. The circuit includes two delay paths to facilitate rising and falling input transitions. Such paths are made up of an equal number and type of current mirrors. The circuit also includes an input differential pair wherein both delay paths are coupled to a single transistor of the pair.

19 Claims, 3 Drawing Sheets

6,020,768

CMOS LOW-VOLTAGE COMPARATOR

BACKGROUND OF THE INVENTION

The present invention relates generally to comparator circuits and, more particularly, to a comparator circuit with improved symmetry in operation.

In many data channels, a digital sample is created by "level-slicing" (also referred to as "data slicing") whereby digital level signals are generated by using a fast comparator to compare the analog input signal to a reference voltage level. The goal in some data channel applications (such as in Compact Disc ("CD") channels) is to accurately generate a digital signal based on zero crossing times. Thus, the transition times of the digital signal should be an accurate reflection of the zero-crossing times of the analog input waveform. (Note that the absolute delay between analog zero-crossing time and digital signal transition time is not of significant importance.) This issue becomes increasingly critical in CD-ROM applications where the raw channel data rates have been increasing from 4.3218 Mb/s (when first introduced) to conceivably greater than 150 Mb/s in the foreseeable future.

FIG. 1 illustrates an ideal, noninverting comparator 100 with an Analog Input path 102, an analog reference voltage ("Vref") input path 106, and a Digital Output path 104. FIG. 2 illustrates the ideal operation of comparator 100 with zero volts (0V) applied to input 106 as Vref. In operation, the Analog Input voltage is compared to Vref. The output voltage should be a digital representation of the polarity of the Analog Input (e.g., if the input voltage is higher than Vref, the output is a logical "1" and conversely, if the input voltage is lower than Vref, the output is a logical "0"). Preferably, the relative zero-crossing times of the analog input are preserved in the Digital Output. Thus, referring to Analog Input waveform 202 and Digital Output waveform 204 of FIG. 2, the equalities as set out in equations (1) through (4) are sought:

$$at1=dt1 \quad (1)$$

$$at2=dt2 \quad (2)$$

$$at3=dt3 \quad (3)$$

$$atx=dtx \quad (4)$$

where x=4,5, etc.

Waveforms 202 and 204 are shown slightly skewed from each other in FIG. 2 due to the absolute delay 206 between analog zero-crossing time and digital signal transition time.

Numerous existing designs attempt to satisfy the equalities of equations (1)–(4). However, they all suffer from jitter (i.e., unmatched rise and fall times of the Digital Output) due to, among other things, input amplitude variations and input slew variations. These input variations affect the delay time through the comparator by creating unmatched (i.e., asymmetric) delays in response to rising and falling transitions of input signals. This problem is particularly acute for high data-rate channels since any jitter (due to asymmetric delays through the comparator) becomes a more significant fraction of the data pulse width and therefore results in a higher data error rate. Furthermore, when implementing this function in state of the art CMOS technologies that require a low supply voltage (i.e., +3.3 v), this problem becomes further exacerbated and therefore even more difficult to correct.

An exemplary inverting comparator circuit 300 known in the art is provided in FIG. 3A. Circuit 300 is implemented in CMOS technology which, as is well known, includes PMOS transistors (i.e., MOS transistors having P-type source/drain regions in N-type substrate) and NMOS transistors (i.e., MOS transistors having N-type source/drain regions in P-type substrate regions). Of course, it will be understood that a transistor symbol with a circle on the gate represents a PMOS transistor and a transistor symbol without a circle on the gate represents an NMOS transistor. The power supply voltage in this circuit is denoted as VDD, which is typically at approximately +5.0 volts or lower (i.e., +3.3 volts). The ground potential in this circuit is denoted as VSS, which is typically at zero volts. In passing, it should be noted that the foregoing symbols and abbreviations apply to all other figures contained herein.

Circuit 300 includes an input differential pair made up of NMOS transistors 302, 304. Analog Input on input path 320 and Vref on input path 322 are coupled to the gates of transistors 302 and 304, respectively. The sources of these transistors are coupled to current source 362 which is, in turn, coupled to VSS. The drain of NMOS transistor 304 is also coupled to current source 364 which is, in turn, coupled to VSS. This drain is also coupled to a current mirror made up of PMOS transistors 314 and 316. Similarly, the drain of NMOS transistor 302 is coupled to current source 360 which is, in turn, coupled to VSS. This drain is further coupled to a second current mirror made up of PMOS transistors 310 and 312.

As shown in FIG. 3A, the sources of transistors 310–316 are coupled to VDD. The drain of PMOS transistor 310 is coupled to the drain of NMOS transistor 306. Transistor 306 with NMOS transistor 308 form a third current mirror in comparator circuit 300. As shown in this figure, the sources of NMOS transistors 306 and 308 are coupled to VSS.

Transistors 316 and 308 form an output stage of circuit 300. In this stage, PMOS transistor 316 functions as a current-sourcing (or current-charging) transistor and NMOS transistor 308 functions as a current-sinking (or current discharging) transistor. Digital Output on output 324 is an inverted digital representation of the polarity of the Analog Input; i.e., when Analog Input is greater than Vref, Digital Output is a logical "0" and when Analog Input is less than Vref, Digital Output is a logical "1".

There are many ways of converting an inverting comparator (like circuit 300) to a noninverting comparator, one of which is by adding an inverter. For example, circuit 300 may be converted to a noninverting comparator by coupling an inverter to output 324. A conventional CMOS inverter 370 containing a PMOS transistor 376 and NMOS transistor 374 is illustrated in FIG. 3B. As shown therein, the gates and drains of transistors 376, 374 are tied together to form input 372 and output 378, respectively. Further, the sources of transistors 376 and 374 are coupled to VDD and VSS, respectively. Coupling output 324 to inverter input 372 would convert circuit 300 into a noninverting comparator with a new output 378.

Referring again to FIG. 3A, current sources 360 and 364 are added to improve circuit speed (i.e., by keeping PMOS transistors 312 and 314, respectively, in a conducting or "ON" state), but are not critical for circuit operation.

In operation, circuit 300 exhibits three fundamental problems. First, input differential pair 302,304 inherently does not operate in a truly differential manner. Input path 322 receives a DC (i.e., non-oscillating) reference voltage (e.g., zero volts) while input path 320 receives a varying (i.e., oscillating) analog voltage. Such disparate inputs lead to asymmetrical delays between rising and falling input transitions producing output signal degradation in the form of jitter.

Second, falling and rising edge paths have different delay paths to output 324. When input path 320 receives a rising transition, current is steered through NMOS transistor 302, mirrored through PMOS transistors 310 and 312, and finally mirrored through NMOS transistors 306 and 308. Hence, the delay path for responding to a rising edge signal includes differential input transistor 302 and two current mirrors. However, a falling transition causes current to be steered through NMOS transistor 304 and mirrored through PMOS transistors 314 and 316. Accordingly, the delay path for responding to a falling edge signal includes differential input transistor 304 and only one current mirror. These differing signal paths will exhibit asymmetric delays which further contributes to jitter in the output signal.

Third, circuit 300 introduces additional jitter to Digital Output when a low power supply is used and the analog input waveform has a high amplitude. As an example, consider the case where a supply voltage VDD of 3.3V is used and the input swings between 0.7V and 3.5V. When current is steered through transistor 302, this transistor will undesirably transition from saturation mode to triode (linear) mode. Transistor 304, however, will always be in saturation mode. The resulting differences in the operation of each transistor presents another asymmetry in delays for a rising versus a falling input edge.

Accordingly, a comparator is desired that serves to reduce or eliminate asymmetry in its operation, like that described above, and thereby produce a more accurate output signal.

SUMMARY OF THE INVENTION

The present invention provides an improved comparator that overcomes disadvantages found in prior-art systems by providing improved symmetry in operation.

In a first embodiment, a comparator circuit is provided that includes an input that receives first and second input signal transitions; an output that receives charging and discharging current in response to the first and second input signal transitions, respectively; a first delay path (coupled to the input and the output) that facilitates application of the charging current to the output in response to the first signal transition; and a second delay path (coupled to the input and the output) that facilitates application of the discharging current to the output in response to the second signal transition, wherein the first and second delay paths operate in approximately the same amount of time.

In another embodiment, a comparator circuit is provided that includes an input transistor coupled to a non-oscillating signal input; a first current mirror coupled to the input transistor and producing a first mirrored current IM1; and a second current mirror coupled to the input transistor and producing a second mirrored current IM2, the second mirrored current representing a portion of a predetermined current value IMAX. This circuit further includes an output stage containing a current-sourcing transistor and a current-sinking transistor, wherein the current-sourcing transistor sources current approximately equal to IM1 and the current-sinking transistor sinks current approximately equal to IMAX–IM2.

In yet another embodiment, a comparator circuit is provided that includes an input differential pair containing a first transistor and a second transistor; a first input path coupled to the first transistor, the first input path receiving an oscillating input signal; and a second input path coupled to the second transistor, the second input path receiving a non-oscillating input signal. Also included in this circuit is a first delay path coupled to the second transistor that conveys a charging current; a second delay path coupled to the second transistor that conveys a discharging current; and an output coupled to the first and second delay paths.

In accordance with the foregoing, a comparator circuit is provided that compares an analog input signal to a reference voltage and creates digital signals whose transition times are a more accurate reflection of the Vref-crossing times of the analog input voltages.

The improved comparator circuit described herein may be used in a variety of applications including CD-ROM drives and other channel applications (such as high-speed cable links, disk-drive channels, and optical fiber channels).

A further understanding of the nature and advantages of the invention may be realized by reference to the remaining portions of the specification and the drawings.

DESCRIPTION OF THE SPECIFIC EMBODIMENT(S)

Figure 4:
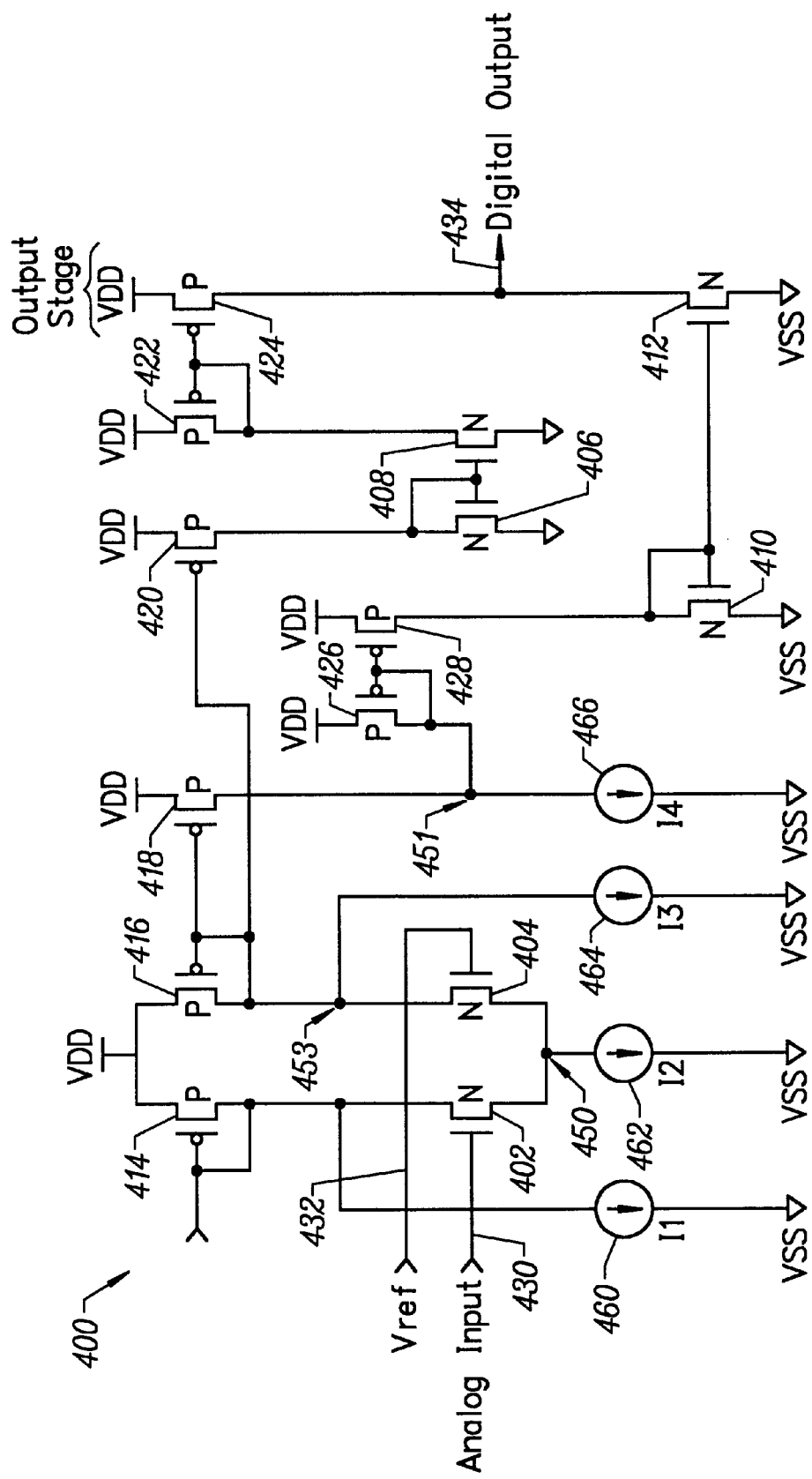
FIG. 4 is a comparator circuit in accordance with a preferred embodiment of the present invention.

FIG. 4 illustrates a schematic circuit diagram of an improved inverting comparator circuit 400, constructed in accordance with the principles of the present invention. Like comparator circuit 300, an input differential pair made up of NMOS transistors 402, 404 functions as an input to this circuit. Specifically, NMOS transistors 402 and 404 receive Analog Input and Vref on input paths 430 and 432, respectively. The sources of these NMOS transistors are tied together at node 450 and are coupled to current source 462 which is, in turn, coupled to VSS. As shown in FIG. 4, current source 462 maintains a current I2. The drain of NMOS transistor 402 is coupled to current source 460 and the drain of PMOS transistor 414. Current source 460 maintains a current I1 and is added to improve circuit speed by keeping PMOS transistor 414 in an ON (i.e., conducting) state. Significantly, as described below, circuit delay paths facilitating responses to rising and falling transitions of Analog Input do not rely upon current conducted by transistor 402 to operate.

The drain of NMOS transistor 404 is coupled to current source 464 which is, in turn, coupled to VSS. As shown in FIG. 4, current source 464 maintains a current I3. Also coupled to the drain of NMOS transistor 404 is PMOS transistor 416. Like current source 460, current source 464 is added to improve circuit speed by keeping PMOS transistor 416 in an ON (i.e., conducting) state.

As illustrated in FIG. 4 and described below, circuit 400 includes a number of current mirrors. In the preferred embodiment, the pairs of transistors that make up each current mirror are approximately identical (i.e., they have approximately the same I/V characteristic curves). As such, in a given current mirror with two transistors, the current conducted in the first transistor whose gate and drain are tied together will be approximately equal to the current mirrored in the second transistor of the pair.

PMOS transistor 416 forms current mirrors with PMOS transistors 418 and 420. The current mirror formed by PMOS transistors 416 and 420 facilitates the application of a charging or sourcing current to output 434 through a first series of current mirrors (the first mirror in this first series being that formed by transistors 416, 420 ). Conversely, the current mirror formed by PMOS transistors 416 and 418 facilitates the application of a discharging or sinking current to output 434 through a second series of current mirrors (the first mirror in this second series being that formed by transistors 416, 418).

In the current mirror formed by transistors 416 and 420, the gates of both transistors are tied to the drain of transistor 416. Accordingly, current being conducted by transistor 416 is mirrored in transistor 420. The mirrored current conducted by transistor 420 is itself mirrored by a second current mirror (in the first series of current mirrors) coupled to PMOS transistor 420. Specifically, NMOS transistors 406 and 408 are coupled to form this second current mirror; i.e., the gates of both transistors are coupled to the drain of NMOS transistor 406. Accordingly, current conducted by transistor 406 is mirrored in transistor 408. Again, the mirrored current conducted by transistor 408 is itself mirrored by a third current mirror coupled to NMOS transistor 408. Specifically, PMOS transistors 422 and 424 are coupled to form a current mirror; i.e., the gates of both transistors are coupled to the drain of PMOS transistor 422. Accordingly, current conducted by transistor 422 is mirrored in transistor 424. This mirrored current serves as a charging or sourcing current for output 434.

Returning to transistor 416, the second current mirror formed by this transistor is that with transistor 418 wherein the gates of both transistors are tied to the drain of transistor 416. Accordingly, current being conducted by transistor 416 is mirrored in transistor 418. Coupled to the drain of transistor 418 is current source 466 which, in turn, is coupled to VSS. This current source maintains current I4.

Also coupled to the drain of transistor 418 is a second current mirror (in the second series of current mirrors) constructed from PMOS transistors 426 and 428. As shown in FIG. 4, the gate and drain of transistor 426 is coupled to the drain of transistor 418. Transistor 426 provides an augmenting current that is combined with the mirrored current of transistor 418 up to the value of I4 at node 451. The current being mirrored by transistor 418 will fluctuate depending upon whether or not transistor 404 is conducting. The resulting difference in current between I4 (representing a maximum value) and current conducted by transistor 418 (representing a dynamic component of I4) is provided by transistor 426.

For example, in the ideal state when transistor 404 is conducting, 402 is turned OFF and all of I2 conducts through 404. Additionally, I3 continues to be sunk from node 453 through current source 464. Accordingly, in such a situation, transistor 418 will mirror a current that approximately equals the value of I2+I3. In this example, assume that the maximum value for I4 is I2 plus two times the value of I3 (i.e., I2+(2* I3)). Then, in this instance, the current provided by transistor 426 will be approximately equal to I3 thereby raising the value of the current leaving node 451 to approximate I4.

On the other hand, should transistor 404 be not conducting, then only I3 would ideally be conducted by transistor 416 and therefore transistor 418 would mirror a value that approximately equals the value of I3. In such instance, to ensure that current source 466 maintains the value of I4, the current provided by transistor 426 will increase to approximately I2+I3.

In the current mirror formed by transistors 426 and 428, the gates of both transistors are tied to the drain of transistor 426. Accordingly, current being conducted by transistor 426 is mirrored in transistor 428. The mirrored current conducted by transistor 428 is itself mirrored by a third current mirror (in the second series of mirrors) coupled to PMOS transistor 428. Specifically, NMOS transistors 410 and 412 are coupled to form a current mirror; i.e., the gates of both transistors are coupled to the drain of NMOS transistor 410. Accordingly, current conducted by transistor 410 is mirrored in transistor 412. This mirrored current serves as a discharging or sinking current for output 434.

Figure 1:
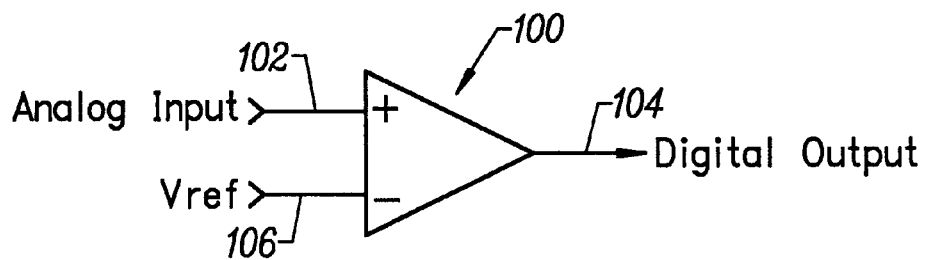
FIG. 1 is a block diagram of an ideal comparator.
Figure 2:
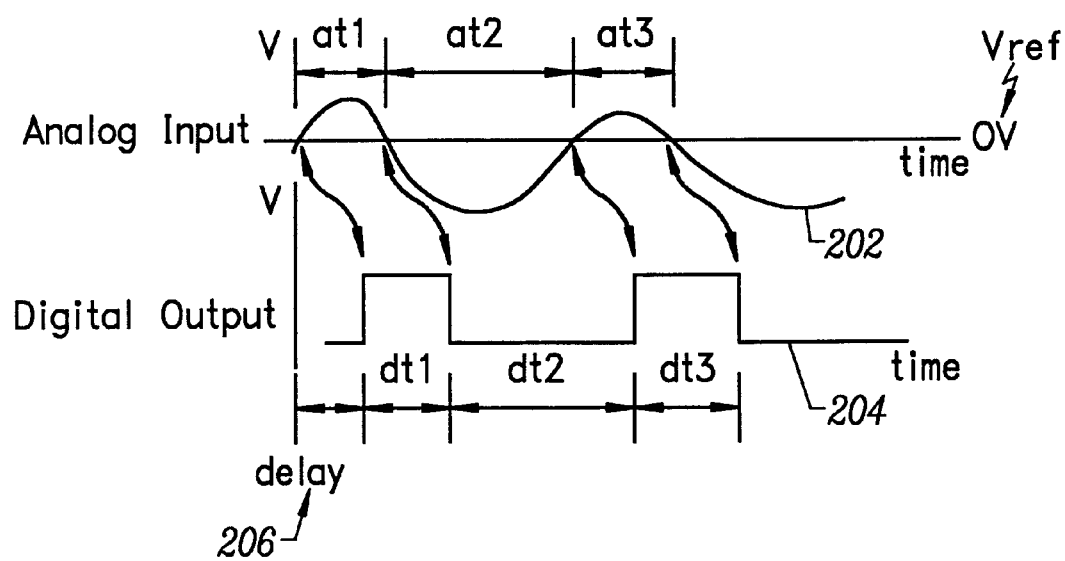
FIG. 2 depicts an Analog Input waveform and Digital Output waveform associated in an ideal timing relationship.
Figure 3A:
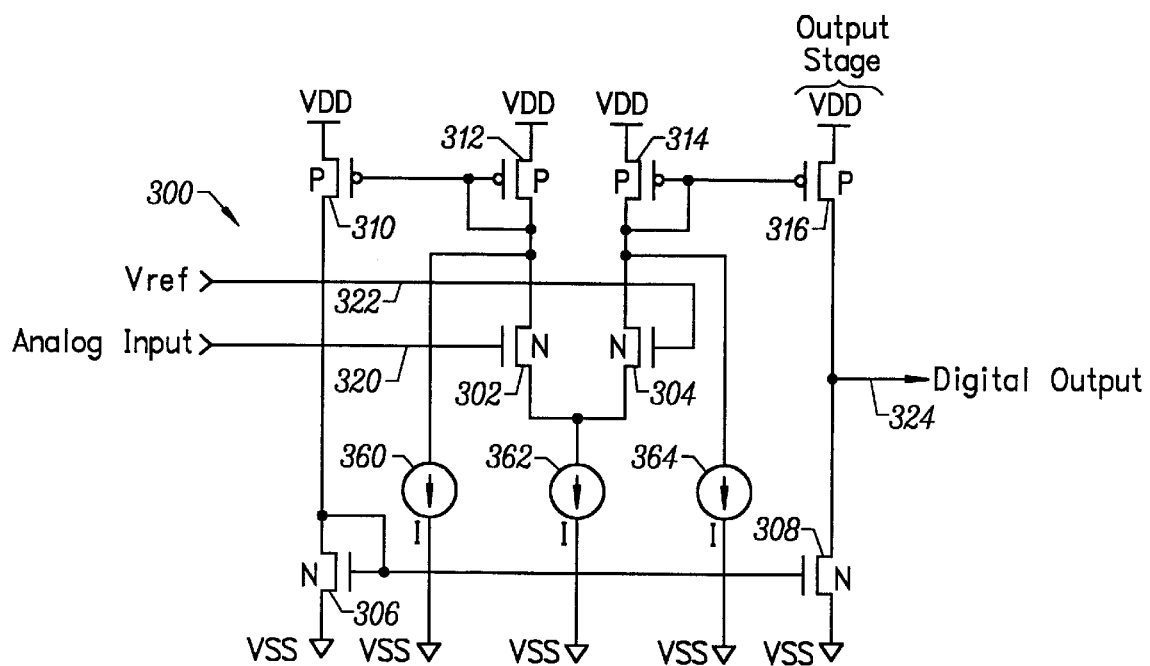
FIG. 3A is an exemplary comparator circuit known in the art.
Figure 3B:
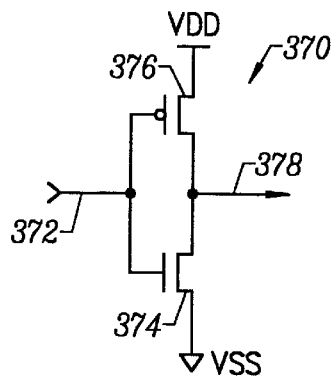
FIG. 3B is an exemplary inverter circuit known in the art.

Transistors 424 and 412 form an output stage of comparator circuit 400. Specifically, transistor 424 functions as a current-sourcing or charging transistor and transistor 412 serves as a current-sinking or discharging transistor. Digital Output on output 434 is an inverted digital representation of the polarity of the Analog Input (on path 430 ); i.e., when Analog Input is greater than Vref, Digital Output is a logical "0" and when Analog Input is less than Vref, Digital Output is a logical "1". As noted above, there are many ways of converting an inverting comparator to a noninverting comparator, one of which is by adding an inverter. For example, circuit 400 may be converted to a noninverting comparator by coupling CMOS inverter 370 (FIG. 3B) to output 434.

Referring again to FIG. 4, VDD (as noted above) represents a power supply voltage. Current I2 is the input differential pair current while currents I1 and I3 are possibly of smaller values and used to maintain transistors 414 and 416 in "ON" states so as to increase the response speed of circuit 400. Currents I1 and I3 provide similar current densities in the transitors for which each create a DC bias current. In a preferred embodiment, currents I1 and I3 are equal. In this embodiment, as in the above example, I4 is approximately equal to I2+(2* I3); of course, other values could be chosen provided that transistor device sizes are ratioed appropriately.

The input differential pair 402, 404 operates as in circuit 300 (FIG. 3); i.e., current I2 is steered either through transistor 402 or 404 depending on whether the Analog Input voltage (on input path 430) is greater than or less than Vref (on input path 432), respectively.

Regarding circuit operation, two events are of particular importance: first, the case of a falling transition where Analog Input falls below Vref, and second, the case of a rising transition where Analog Input rises above Vref. In the first case, current I2 is steered through transistor 404. As a result, current approximately equal to the summation of I2 and I3 (i.e., I2+I3) is conducted through transistor 416. This same current is mirrored in the first series of current mirrors (i.e., mirrors formed from transistor pairs 416/420, 406/408 and 422/424) to provide a charging current approximately equal to I2+I3 at output 434.

At the same time, a second current approximately equal to I3 is conducted by transistor 426 as a result of transistor 418 mirroring current approximately equal to I2+I3. As noted above, current conducted by transistor 426 is approximately equal to the difference between I4 and current conducted by transistor 418. Since, in this embodiment, I4 approximately equals I2+(2* I3), when transistor 418 mirrors current approximately equal to I2+I3, transistor 426 conducts current approximating I3. The remaining current mirrors in the second series of mirrors (i.e., mirrors formed from transistor pairs 426/428 and 410/412) mirror current approximately equal to I3 to provide a discharging current of this same amount to output 434.

Summing the charging current from transistor 424 (approximately I2+I3) and the discharging current from transistor 412 (approximately I3) results in a net charging current for output 434 of approximately I2. As noted above, circuit 400 represents an inverting comparator. Hence a net charging current is provided to output 434 in the case of a falling transition; i.e., where Analog Input falls below Vref.

In the second case (i.e., a rising transition), I2 is steered away from transistor 416 and to transistor 414. As a result, current approximately equal to I3 is conducted through transistor 416. Again, this same current is mirrored in the first series of current mirrors to provide a charging current approximately equal to I3 at output 434. At the same time, a second current approximately equal to I2+I3 is conducted by transistor 426 as a result of transistor 418 mirroring current approximately equal to I3. The remaining current mirrors in the second series of current mirrors mirror current approximately equal to I2+I3 to provide a discharging current of this same amount to output 434.

Summing the charging current from transistor 424 (approximately I3) and the discharging current from transistor 412 (approximately I2+I3) results in a net discharging current for output 434 of approximately I2. As a result of the inverting nature of circuit 400, a net discharging current is provided to output 434 in the case of a rising transition; i.e., where Analog Input rises above Vref.

The first series of current mirrors (i.e., transistor pairs 416/420, 406/408 and 422/424) represents a delay path in circuit 400 for responding to a falling transition of an input signal; i.e., where Analog Input falls below Vref. In accordance with the foregoing discussion, when circuit 400 receives such a falling transition this delay path controls the value of Digital Output applied to output 434 (i.e., a net charging current which results in a logical "1").

Conversely, the second series of current mirrors (i.e., transistor pairs 416/418, 426/428 and 410/412) represents a delay path in circuit 400 for responding to a rising transition of an input signal; i.e., where Analog Input rises above Vref. When circuit 400 receives such a rising transition, this delay path controls the value of Digital Output applied to output 434 (i.e., a net discharging current which results in a logical "0").

Significantly, as shown in FIG. 4 and in Table 1 below, these two delay paths are theoretically equal. Referring to the Table, current mirror pairs 1 and 3 are P-type current mirrors (i.e., constructed from PMOS transistors) while current mirror pair 2 are N-type current mirrors (i.e., constructed from NMOS transistors). Moreover, the corresponding transistors for each path as identified in Table 1 (e.g., transistors 420 and 418, 406 and 410, 408 and 412, etc.) are constructed to have similar operating characteristics (e.g., speed). Since each path contains the same number and type of current mirrors (as well as similar underlying transistors), the delay paths will operate in approximately the same amount of time. This overcomes a first fundamental problem of circuit 300; namely, different delay paths with different numbers and types of current mirrors for responding to falling and rising transitions of input signals.

TABLE 1

| Current Mirror Pair | Changing Current Delay Path | Discharging Current Delay Path |
|---|---|---|
| 1 | Transistors 416, 420 | Transistors 416, 418 |
| 2 | Transistors 406, 408 | Transistors 410, 412 |
| 3 | Transistors 422, 424 | Transistors 426, 428 |

Referring again to FIG. 4, both delay paths identified above are connected to and rely upon transistor 416 for producing mirrored current. Significantly, unlike circuit 300, rising current in transistor 414 is not relied upon to produce a net discharging current at output 434. Such configuration is particularly beneficial since rising current in transistor 414 is inaccurate due to the fact that Analog Input couples the gate-to-drain capacitance of transistor 402 directly to that current. Furthermore, when Analog Input rises, node 450 also follows, thus diverting some charge from I2 that should have otherwise been steered through transistor 414, via the node to substrate capacitance (i.e., source/drain diffusion capacitance and drain-to-gate capacitance) on node 450. If a delay path were to use the drain current of transistor 414, significant asymmetry would be introduced in comparator circuit 400. Hence, through the architecture of circuit 400, another problem associated with circuit 300 is avoided; namely, the inherently non-differential operation of the input differential pair.

Finally, like circuit 300, when a reduced power supply voltage, such as +3.3V (typical in 0.5 $\mu$m and smaller geometry CMOS technologies) is used, a large positive excursion in Analog Input will cause transistor 402 to go out of saturation (and into linear mode) thus causing asymmetrical capacitive charging current from Analog Input predominately via the gate-to-channel capacitance of transistor 402. As shown in FIG. 4, this detrimental operation is avoided by hanging delay paths for both rising and falling transitions exclusively off of transistor 404. Hence, the detrimental effects of a low power supply, as identified above in connection with circuit 300, are avoided through the architecture of circuit 400.

Circuit 400 is well suited for high-speed data channels; e.g., 32X-speed or greater CD-ROM drives. In such an application, Analog Input would be the "RF" data signal derived from the output of photodiodes disposed within a conventional optical pickup in the CD-ROM drive.

While the foregoing is a complete description of the embodiment of the invention, various modifications, alternatives and equivalents may be used. For example, circuit 400 as shown is designed in a CMOS technology. Other process technologies may also be used, such as JFET, MESFET, etc. Moreover, the PMOS and NMOS transistors shown in FIG. 4 may be swapped. Accordingly, the above description should not be taken as limiting the scope of the invention which is defined by the appended claims.

What is claimed is:

1. A comparator circuit comprising:
   a differential input circuit that receives first and second analog input signal transitions for comparison with a reference voltage,
   an output circuit that receives charging and discharging current in response to said first and second input signal transitions, respectively;
   a first delay path comprising a first plurality of current mirrors coupled to said input circuit and said output circuit that facilitates application of said charging current to said output in response to said first signal transition; and a second delay path coupled to said input circuit and said output circuit that facilitates application of said discharging current to said output circuit in response to said second signal transition, wherein said first and second delay paths operate in approximately the same amount of time.

2. The comparator circuit of claim 1 wherein said second delay path comprises a second plurality of current mirrors, said first plurality of current mirrors being equal in number to said second plurality of current mirrors.

3. The comparator circuit of claim 2 wherein said first and second plurality of current mirrors each contain an equal number of P-type and N-type current mirrors.

4. The comparator circuit of claim 1 wherein said input circuit comprises a differential pair having a first and a second transistor, and wherein said first and second delay paths are coupled to said first transistor.

5. The comparator circuit of claim 4 wherein said first transistor is coupled to said reference voltage and said second transistor is coupled to an oscillating signal input.

6. A comparator circuit comprising:

a first input transistor coupled to a non-oscillating signal input and a second input transistor coupled to an analog signal;

a first current mirror coupled to said first input transistor and producing a first mirrored current IM1;

a second current mirror coupled to said first input transistor and producing a second mirrored current IM2, said second mirrored current representing a portion of a predetermined current value IMAX; and an output stage containing a current-sourcing transistor and a current-sinking transistor for producing a digital output, wherein said current-source transistor sources current approximately equal to IM1 and said current-sinking transistor sinks current approximately equal to IMAX−IMA.

7. The comparator circuit of claim 6 wherein said first current mirror and said current-sourcing transistor delineate a beginning and an end, respectively, of a first delay path;

said second current mirror and said current-sinking transistor delineate a beginning and an end, respectively, of a second delay path; and said first and second delay paths operate in approximately the same amount of time.

8. The comparator circuit of claim 7 wherein:

said first delay path includes a first plurality of current mirrors;

said second delay path includes a second plurality of current mirrors; and said first plurality of current mirrors are equal in number to said second plurality of current mirrors.

9. The comparator circuit of claim 8 wherein said first and second plurality of current mirrors each contain an equal number of P-type and N-type current mirrors.

10. A comparator circuit comprising:

an input differential pair containing a first transistor and a second transistor;

a first input path coupled to said first transistor, said first input path receiving an oscillating input signal;

a second input path coupled to said second transistor, said second input path receiving a non-oscillating input signal;

a first delay path coupled to said second transistor that conveys a charging current;

a second delay path coupled to said second transistor that conveys a discharging current; and an output coupled to said first and second delay paths.

11. The comparator circuit of claim 10 wherein said output receives a net charging current when said oscillating input signal transitions from a first state to a second state.

12. The comparator circuit of claim 11 wherein said output receives a net discharging current when said oscillating input signal transitions from said second state to said first state.

13. The comparator circuit of claim 10 wherein said first and second delay paths comprise a first and second plurality of current mirrors, respectively.

14. The comparator circuit of claim 13 wherein said first plurality of current mirrors are equal in number to said second plurality of current mirrors.

15. The comparator circuit of claim 13 wherein said first and second plurality of current mirrors each contain an equal number of P-type and N-type current mirrors.

16. The comparator circuit of claim 10 wherein said circuit is implemented in CMOS technology.

17. The comparator circuit of claim 10 wherein said second delay path comprises:

a third transistor coupled to said second transistor, said third transistor conducting a first current;

a current source coupled to said third transistor maintaining a maximum current, said maximum current being greater than said first current; and a fourth transistor coupled to said third transistor and conducting a second current, said first current combined with said second current producing said maximum current.

18. The comparator of claim 17 wherein said first current is a mirrored current.

19. The comparator of claim 18 wherein said second current is approximately equal to said discharging current.

* * * * *